(12) United States Patent
Shimada et al.

(10) Patent No.: US 6,538,335 B2
(45) Date of Patent: Mar. 25, 2003

(54) SEMICONDUCTOR APPARATUS AND A SEMICONDUCTOR DEVICE MOUNTING METHOD

(75) Inventors: Toshiyasu Shimada, Tokyo (JP); Rieka Ohuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/057,572

(22) Filed: Jan. 24, 2002

(65) Prior Publication Data

US 2002/0100988 A1 Aug. 1, 2002

(30) Foreign Application Priority Data

Jan. 29, 2001 (JP) .......................... 2001-020467

(51) Int. Cl.[7] .......................... H01L 23/48; H01L 23/52; H01L 29/40
(52) U.S. Cl. .......................... 257/780; 257/781
(58) Field of Search .......................... 257/758, 750, 257/784, 786, 739, 740, 780, 781

(56) References Cited

U.S. PATENT DOCUMENTS

| | | | | |
|---|---|---|---|---|
| 4,937,653 A | * | 6/1990 | Blonder et al. | |
| 5,185,073 A | * | 2/1993 | Bindra et al. | |
| 5,929,521 A | * | 7/1999 | Wark et al. | |
| 5,962,921 A | * | 10/1999 | Farnworth et al. | |
| 5,977,642 A | * | 11/1999 | Appelt et al. | |
| 6,088,236 A | * | 7/2000 | Tomura et al. | |
| 6,150,255 A | * | 11/2000 | Downes, Jr. et al. | |

FOREIGN PATENT DOCUMENTS

| | | |
|---|---|---|
| JP | 7-201917 | 8/1995 |
| JP | 10-50765 | 2/1998 |
| JP | 10-270498 | 10/1998 |

OTHER PUBLICATIONS

Hatada, Kenzo, "Assembly Technology by Conductive Adhesive", *Journal of Japan Institute for Interconnecting and Packaging Electronic Circuits*, vol. 11, No. 5, 1996, P. 347.

Dohya, Akihiro et al., "PDA (Personal Digital Assistance)", *Journal of Japan Institute for Interconnecting anf Packaging Electronic Circuits*, vol. 11, No.5, 1996, P. 319.

Tsukada, Yutaka, "Flip Chip Bonding Technology", *Journal of Japan Institute for Interconnecting and Packaging Electronic Circuits*, vol. 11, No. 5, 1996, P. 343.

* cited by examiner

*Primary Examiner*—Sheila V. Clark
(74) *Attorney, Agent, or Firm*—Choate, Hall & Stewart

(57) ABSTRACT

A semiconductor apparatus includes a mount pad formed on a substrate and a bump formed on a semiconductor device. A plurality of needle-like or branch-like protrusions is formed on at least one of the mount pad and the bump. The plurality of protrusions of one of the mount pad and the bump engages with the other. The plurality of protrusions protrudes in directions crossing each other, or protrudes to random directions.

26 Claims, 5 Drawing Sheets

SEMICONDUCTOR APPARATUS AND A SEMICONDUCTOR DEVICE MOUNTING METHOD

BACKGROUND OF THE INVENTION

1. Field of the Invention

The present invention relates to a semiconductor apparatus and a semiconductor device mounting method. More particularly, the present invention relates to a semiconductor apparatus and a semiconductor device mounting method in which a mechanical connection force is improved between a substrate and a semiconductor device.

2. Description of the Related Art

In recent years, the miniaturization of an electronic apparatus has been advanced, and its price has come down. In association with them, a flip-chip method is proposed as a structure in which semiconductor devices are mounted at a high density.

The semiconductor device mounting method in the flip-chip method is the method of connecting a semiconductor device, in which a plurality of bump electrodes are mounted on at least one surface, to a circuit substrate, by performing a face-down on a side on which the bump is mounted.

A conventional flip-chip mounting structure will be described below with reference to FIG. 1.

As shown in FIG. 1, in the conventional flip-chip mounting structure, a mount pad 73 is formed on a circuit substrate 71. A plurality of bumps 74 is formed on the surface of the side of the circuit substrate 71 on a semiconductor device 72. The mount pad 73 is usually produced by copper plating. Nickel-gold plating is coated thereon. Its surface is relatively smooth.

Then, the semiconductor device 72 is mounted on the substrate 71 by connecting the mount pad 73 to the bump 74. The followings are the conventional connecting methods.

As a first method, a gold protruded bump (bump 74) is firstly formed on the semiconductor device 72 by using a wire bonding method. Next, Ag paste is coated on an upper portion of the protruded bump. Then, the protruded bump is pushed against the mount pad 73, and adhered thereto (Journal of Japan Institute for Interconnecting and Packaging Electronic Circuits, Vol. 11, No.5 (1996) P347).

As a second method, the gold protruded bump (bump 74) is firstly formed on the semiconductor device 72 by using the wire bonding method. Then, the protruded bump and the substrate 71 are soldered to each other (Journal of Japan Institute for Interconnecting and Packaging Electronic Circuits, Vol. 11, No.5 (1996) P319).

And, as a third method, the gold protruded bump (bump 74) is firstly formed on the semiconductor device 72 by using the wire bonding method. Next, solder is sent to the mount pad 73. Then, the bump 74 and the mount pad 73 are soldered to each other (Journal of Japan Institute for Interconnecting and Packaging Electronic Circuits, Vol. 11, No.5 (1996) P343).

In all the above-mentioned methods, as shown in FIG. 1, after the semiconductor device 72 is placed on the substrate 71, a seal resin 75 is filled between them. In this configuration, the pad 73 and the bump 74 are integrally bonded over the boundary between them. However, the thermal expansion coefficient of the semiconductor device 72 is different from that of the substrate 71. In particular, it differs from an organic substrate by as much as five times. For this reason, large stress is induced in a connection portion, which may result in an occurrence of a connection defect. Thus, by filling the seal resin 75 between the semiconductor device 72 and the substrate 71, it is necessary to disperse the stress.

A connecting method of using a contraction force of the seal resin 75 will be described below with reference to FIGS. 2A to 2B. At first, the seal resin 75 is placed on the substrate 71 on which the semiconductor device 72 is placed. Next, as shown in FIG. 2B, a position of the semiconductor device 72 is made coincident with that of the mount pad 73 by carrying out the face-down. As shown in FIG. 2C, while the semiconductor device 72 is placed on the substrate 71 and a tip of the bump 74 is deformed under a heating and pressing process, the mount pad 73 and the bump 74 come in direct contact with each other. At that time, until the seal resin 75 is cured, the heating and pressing process is continued to thereby obtain the mechanical electronic connection.

In the above-mentioned methods, the semiconductor device 72 and the substrate 71 are not mechanically fixed until the seal resin 75 is cured. For this reason, it is difficult that immediately after placing the semiconductor device 72 on the substrate 71, it is moved to another apparatus and the heating and pressing process is done in order to shorten an occupation time of the mounted unit.

In view of the above-mentioned circumstances, a semiconductor apparatus having an excellent productivity is desirable in which the mechanical connection force is improved between the substrate 71 and the semiconductor device 72.

As the related technique, Japanese Laid Open Patent Application (JP-A-Heisei 10-50765) discloses a method of mounting a semiconductor device and a technique of a semiconductor apparatus. The semiconductor apparatus based on this technique is formed by mounting the semiconductor device on a substrate. It has a mount pad, a bump electrode and a seal resin. Here, the mount pad is formed on the substrate, and it has a concave and convex portion on the surface thereof. The bump electrode is formed on the surface of the substrate side of the semiconductor device, and it is arranged while it is inserted into the concave and convex portion of the mount pad. The seal resin exists between the semiconductor device and the substrate.

It is described that this technique is used to insert the bump electrode into the concave and convex portion formed on the surface of the mount pad, and the connection strength is improved.

Japanese Laid Open Patent Application (JP-A-Heisei 7-201917) discloses a technique of a circuit formation substrate and a method of manufacturing the same. The circuit formation substrate based on this technique has an electrically insulating substrate, a thin film metallic electrode disposed on a surface of the electrically insulating substrate, and an electronic part electrically connected through a bump to the thin film metallic electrode. Then, a concave and convex layer is formed on the surface of the thin film metallic electrode or the electrically insulating substrate of the ground thereof.

It is described that since the respective bonding conditions (contacts) between the electrically insulating substrate, the thin film metallic electrode and the bump can be made stronger by using this technique, the reliability can be improved.

Japanese Laid Open Patent Application (JP-A-Heisei 10-270498) discloses a technique of a method of manufacturing an electronic apparatus. The electronic apparatus manufacturing method based on this technique includes the steps of: preparing an electronic device in which a solder protrusion electrode is formed on a surface; preparing a wiring substrate in which a needle-like electrode made of a material having a melting point higher than that of a member of the solder protrusion electrode and having a high elastic coefficient is formed on a surface; making a position of the solder protrusion electrode and a position of the needle-like electrode coincide with each other, pushing the needle-like electrode until it reaches a ground electrode of the solder protrusion electrode and carrying out a tentative connection; and performing a re-flow on the solder protrusion electrode and regularly connecting the electronic device and the wiring substrate to each other.

It is described that this technique can shorten the step of manufacturing the electronic apparatus and can also improve the yield of the electronic apparatus.

However, since the semiconductor apparatuses disclosed in the above-mentioned gazette have the concave and convex portion on the surface of the substrate, they are strong against a stress in a flat direction, and weak against a vertical force. This is because their convex portion and needle-like electrode are wide near the side of the surface of the mount pad, the substrate and the electrode, and narrow near their tip side of the convex and the needle. Therefore, they have no substantial resistance against a thermal expansion or an external force in a vertical direction that causes the semiconductor device to be stripped from the substrate. Also, if the concave and convex portion is formed by using sand blast, metallic powder and the like, since it has the basic shape similar to a sphere or a polygon, a sufficiently large particle is needed in order to obtain an effective height as an anchor. For example, if a concave and convex portion having a depth of 5 µm is formed by using the sand blast, a grind stone having a diameter of at least 10 µm is needed. Thus, it is difficult to form the effective concave and convex portion in a narrow pad having a width of approximately several 10 µm.

SUMMARY OF THE INVENTION

Therefore, an object of the present invention is to provide a semiconductor apparatus in which a mechanical connection force is improved between a substrate and a semiconductor device Another object of the present invention is to provide a semiconductor device mounting method having an excellent productivity in which a mechanical connection force is improved between a semiconductor device and a substrate.

Still another object of the present invention is to provide a semiconductor apparatus and a semiconductor device mounting method, which their reliability is improved.

In order to achieve an aspect of the present invention, present invention provide a semiconductor apparatus including a mount pad formed on a substrate and a bump formed on a semiconductor device. In the semiconductor apparatus, a plurality of needle-like or branch-like protrusions is formed on at least one of the mount pad and the bump. The plurality of protrusions of one of the mount pad and the bump engages with the other.

In the semiconductor apparatus, the plurality of protrusions protrudes in directions crossing each other.

In the semiconductor apparatus, the plurality of protrusions protrudes to random directions.

In the semiconductor apparatus, a length of the plurality of protrusions is 5 to 10 µm.

In the semiconductor apparatus, a number of the plurality of protrusions is 100000 to 200000/mm².

In the semiconductor apparatus, a length of the plurality of protrusions is 10 to 15 µm.

In the semiconductor apparatus, a number of the plurality of protrusions is 50000 to 100000/mm².

In the semiconductor apparatus, the substrate is produced by one of a full additive process and a sub additive process, and the plurality of protrusions is formed only on a side of the semiconductor device of the mount pad.

In the semiconductor apparatus, the plurality of protrusions is coated with Au.

In the semiconductor apparatus, the bump includes Au.

In the semiconductor apparatus, the mount pad includes Au.

In the semiconductor apparatus, the protrusions are coated with a low temperature brazing filler metal of non-lead system.

In the semiconductor apparatus, the plurality of protrusions is formed by a plating method.

In the semiconductor apparatus, seal resin is filled between the semiconductor device and the substrate.

In order to achieve another aspect of the present invention, present invention provide a semiconductor device mounting method including the steps of (a) forming a plurality of needle-like or branch-like protrusions on a surface of at least one of a mount pad formed on a substrate and a bump formed on a semiconductor device; and (b) positioning the semiconductor device on the substrate such that the bump faces the mount pad and the plurality of protrusions of one of the mount pad and the bump engages with the other.

In the semiconductor device mounting method, the (b) positioning step includes the step of (c) pressing the semiconductor device on the substrate.

In the semiconductor device mounting method, the (c) pressing step includes the step of (d) heating the semiconductor device and the substrate at temperature sufficient to form contact between the bump and the mount pad.

In the semiconductor device mounting method, the (a) forming step uses a plating method for forming the plurality of protrusions.

In the semiconductor device mounting method, the (a) forming step includes the step of (e) supplying seal resin onto the substrate, and the (b) positioning step includes the step of (f) curing the seal resin.

In the semiconductor device mounting method, the seal resin is cured by a unit different from a unit placing the semiconductor device on the substrate.

DESCRIPTION OF THE PREFERRED EMBODIMENTS

A semiconductor apparatus of the present invention will be described below with reference to the attached drawings.

Figure 1:
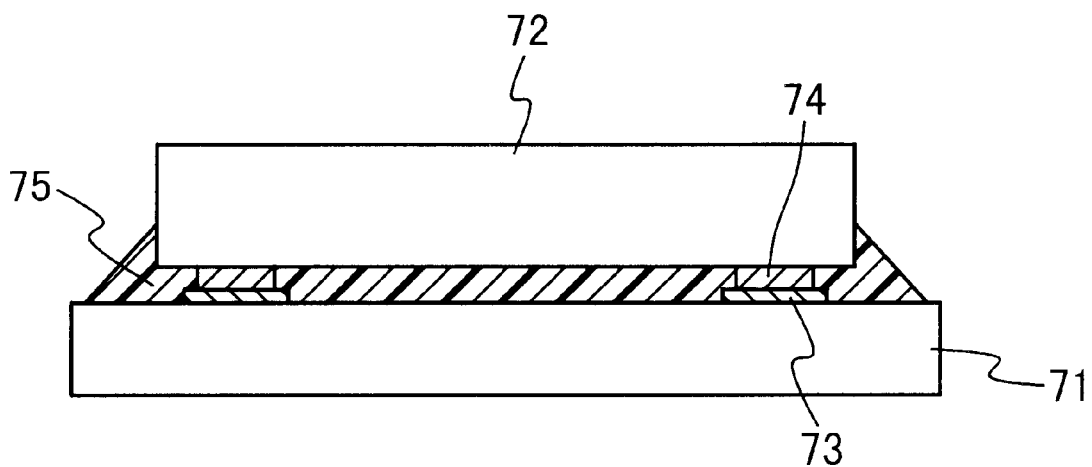
FIG. 1 is a sectional view showing a conventional flip-chip mount structure.
Figure 2A:
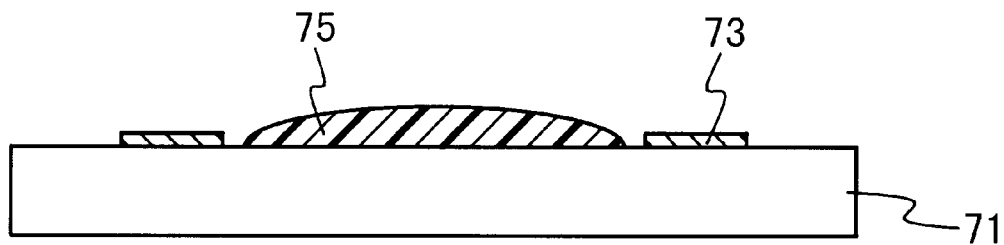
FIGS. 2A, 2B and 2C are sectional views showing a conventional flip-chip mounting method.
Figure 2B:
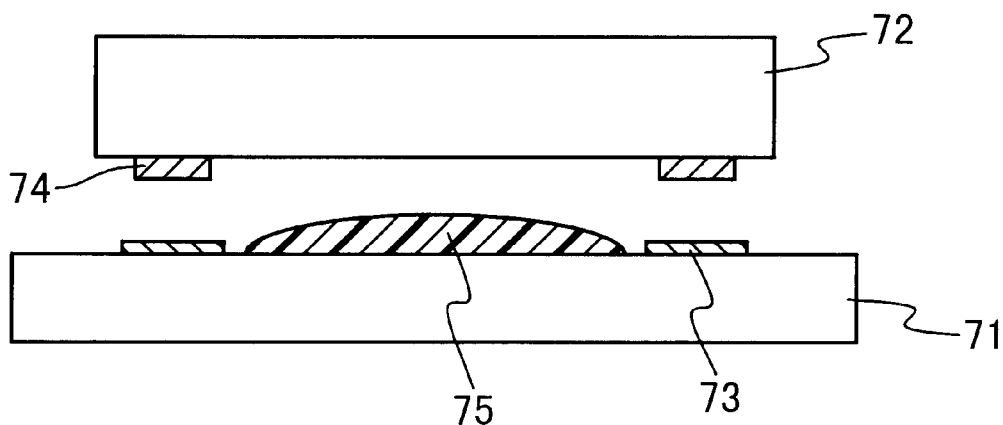
Figure 2C:
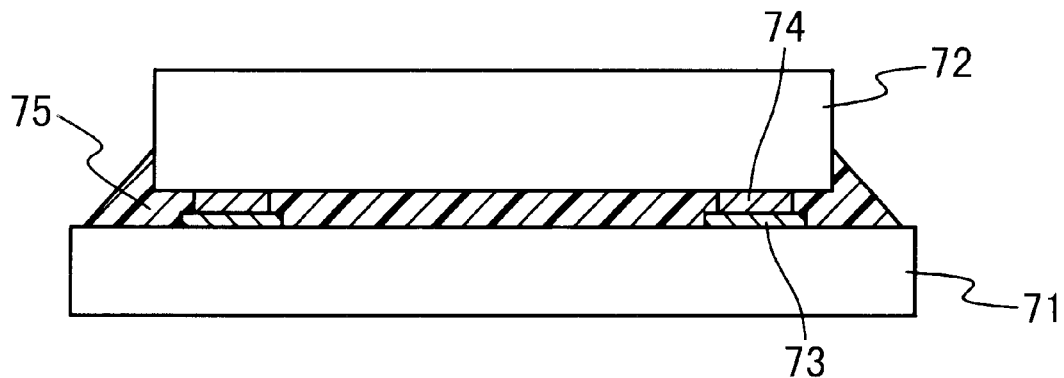
Figure 3:
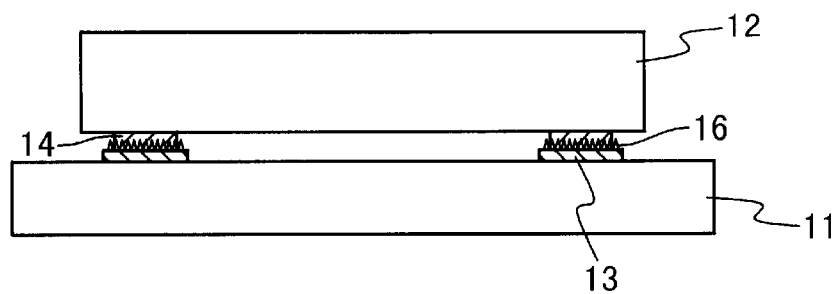
FIG. 3 is a sectional view showing a configuration of an embodiment of a semiconductor apparatus according to the present invention.

FIG. 3 is a sectional view showing a semiconductor apparatus according to the present invention. As shown in FIG. 3, the semiconductor apparatus of the present invention is configured such that a mount pad 13 formed on a substrate 11 and a bump 14 formed on a semiconductor device 12 are electrically bonded to each other. An anchor portion 16 including a needle-like or branch-like plating (protrusion) is formed on the mount pad 13, and it engages with (is stuck to) the bump 14. Then, the bump 14 is plastically deformed, and embedded around the anchor portion 16. Accordingly, anchor junction is formed.

Incidentally, "anchor portion" in this specification implies the convex (protrusion) portion inserted into (engaged with) the mount pad or the bump placed on the opposite side of the anchor portion. Since this anchor portion is inserted into the mount pad on the opposite side or the bump, the anchor junction between the mount pad and the bump is established to thereby improve the mechanical connection force between the semiconductor device of the semiconductor apparatus and the substrate.

Figure 7:
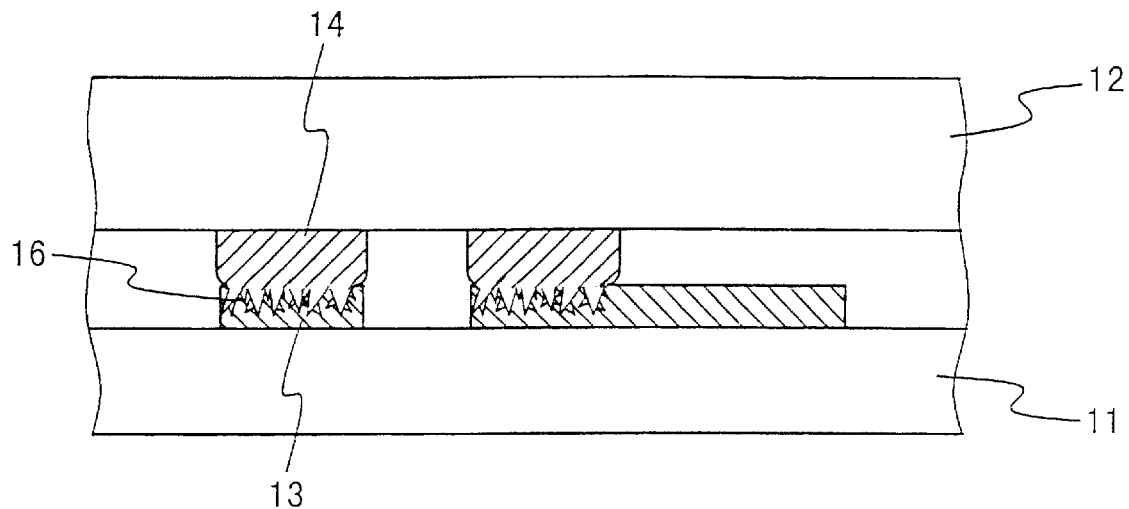
FIG. 7 is a sectional view showing still another embodiment of a semiconductor apparatus according to the present invention.

FIG. 3 shows the semiconductor apparatus in which the anchor portion 16 (the needle-like or branch-like plating or protrusion) is formed on the mount pad 13. However, as shown in FIG. 7, the anchor portion 16 may be formed on the bump 14.

Since the anchor portion 16 having the needle-like or branch-like shape is formed on the bump 14, the surface of the semiconductor device 12 is not damaged by the anchor portion 16, as compared with the case in which the anchor portion 16 is formed on the mount pad 13.

The anchor portion 16 has the needle-like or branch-like shape. Thus, the semiconductor apparatus of the present invention has the anchor junction between the substrate and the semiconductor device, which results in the improvement in the mechanical connection force.

Also, at least a pair of needle-like or branch-like protrusions, which are protruded in directions crossing each other, is formed as the anchor. That is, the growth directions of the protrusions are random directions. Then, in the case the pressing action is further continued after the insertion into the bump, if the bump is made of gold, it surrounds the periphery of the anchor portion while it is plastically deformed. Hence, it is integrated with the anchor portion so that the mechanical connection can be obtained which is strong against the vertically external force as well as the flatly (horizontal) external force.

The anchor portion 16 is constituted by the needle-like or branch-like plating. A length of the needle or the branch is preferably 5 $\mu$m to 20 $\mu$m. Further preferably, it is 5 $\mu$m to 15 $\mu$m. If the length of the plating is less than 5 $\mu$m, there may be a case that the plating is not stuck to the bump 14 (or the mount pad 13 if the anchor portion 16 is formed on the bump 14) or the stuck depth is insufficient. On the other hand, if the length of the plating exceeds 20 $\mu$m, there may be a case that the plating is stuck to the semiconductor device 12. Thus, it is desired to be in the above-mentioned range.

The length of the plating is usually approximately 5 to 10 $\mu$m or 10 to 15 $\mu$m, depending on the required strength of the junction.

Also, the number of the needle or the branch of the plating to be formed in the anchor portion 16 is desired to be 50000 to 200000 per $mm^2$. The number of the needle or the branch of the plating to be usually formed is 50000 to 100000 or 100000 to 200000 per $mm^2$ depending on the required strength of the junction.

Any method can be employed as the method of forming the needle-like or branch-like plating as the anchor portion 16. For example, it can be formed by using the method described later in the semiconductor device mounting method according to the present invention.

On the substrate 11, the circuit formed by using the devices, exemplified in the semiconductor device 12, is mounted. The substrate 11 is desired to be produced by using the full additive process or the sub additive process. In the substrate 11 produced by one of the two processes, the plating of the anchor portion 16 is formed only on the side of the semiconductor device 12 of the mount pad 13. Due to such configuration, it does not come into contact with the anchor portion 16 formed on the adjacent mount pad 13. Thus, it is possible to protect an occurrence of short.

Also, the substrate 11 is made of typical materials used to manufacture the semiconductor apparatus. There is no particular limit. For example, it is possible to use a printed circuit board that uses epoxy material as a member.

The mount pad 13 is made of, for example, copper. Gold layer having a thickness of 5 $\mu$m or more is desired to be formed on the mount pad 13. Due to such configuration, if the needle-like or branch-like plating as the anchor portion 16 is formed on the bump 14, the plating is easily stuck to the mount pad 13. Thus, the anchor junction is easily formed.

The bump 14 is desired to be the gold bump. Due to such configuration, if the needle-like or branch-like plating as the anchor portion 16 is formed on the mount pad 13, the plating is easily stuck to the bump 14. Also, the plastic deformation is brought about, which is embedded in the periphery of the needle-like or branch-like plating. Thus, the anchor junction is easily formed.

Gold plating may be formed on the surface of the needle-like or branch-like plating as the anchor portion 16. Since the gold plating is formed on the surface of the plating, if the gold layer is formed on the portion to which the plating is stuck, the portion between the semiconductor device 12 and the substrate 11 functions as the metallic junction. Thus, the mechanical connection force between the semiconductor device 12 and the substrate 11 is further improved.

In the semiconductor apparatus of the present invention, the metallic junction is desired to be formed between the bump 14 and the mount pad 13. For example, the metallic junction is formed by making the surface of the mount pad 13 and the bump 14 of gold. However, if the usage of a certain material enables the formation of the metallic junction, any material may be used (for example, a metal having a low resistance).

The plating of using the low temperature brazing filler metal of non-lead system may be formed on the needle-like or branch-like plating as the anchor portion 16. Thus, even if the pressure when it is manufactured is low, the solder (the low temperature brazing filler metal) is melted by a heating process so that the solder connection to the bump 14 can be established. Hence, the semiconductor apparatus can be manufactured at a cost cheaper than that of the usage of the gold.

Figure 8:
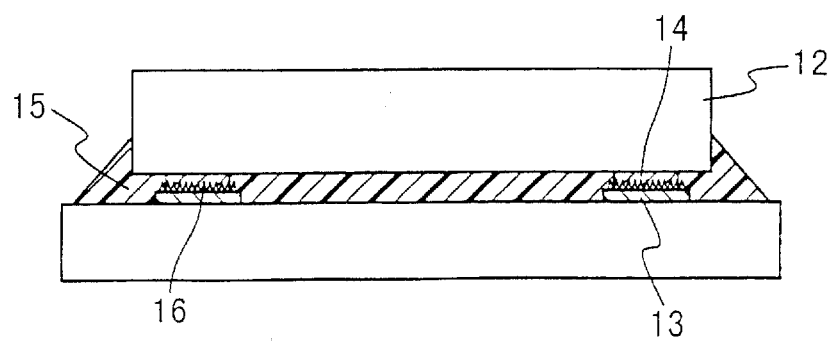
FIG. 8 is a sectional view showing yet still another embodiment of a semiconductor apparatus according to the present invention.

As shown in FIG. 8, the semiconductor apparatus of the present invention may have a seal resin 15 between the semiconductor device 12 and the substrate 11. Since having the seal resin 15 between the semiconductor device 12 and the substrate 11, the semiconductor apparatus of the present invention can further improve the mechanical connection force. In addition, it is possible to protect the semiconductor device 12 from being contaminated by impurity.

In this case, as the seal resin 15 to be used, the seal resin can be used which is typically used to manufacture the semiconductor apparatus. For example, it is possible to use the thermally curing resin of epoxy system.

The semiconductor apparatus manufacturing method according to the present invention has no particular limitation. For example, it can be manufactured by using the semiconductor device manufacturing method according to the present invention, as described later.

FIG. 7 is a sectional view showing the semiconductor apparatus of the present invention. The needle-like or branch-like plating as the anchor portion 16 may be also formed on the bump 14. The surface of the semiconductor device 12 is not damaged by the plating, as compared with the case of the formation on the mount pad 13.

In this case, although the mount pad 13 is made of, for example, copper, the gold layer having a thickness of 5 μm or more is desired to be formed on the surface thereof. Due to such configuration, the plating is easily stuck to the gold bump, and the anchor junction is easily formed.

Figure 4A:
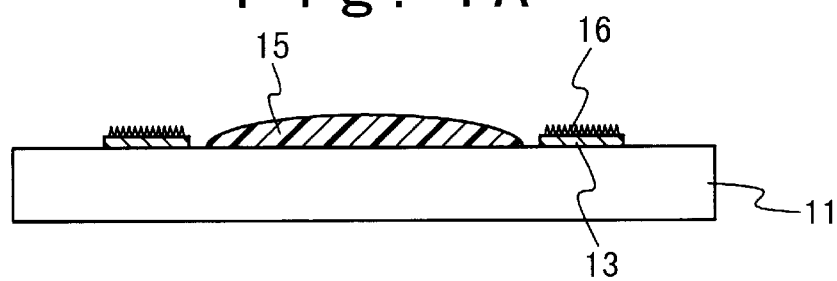
FIGS. 4A, 4B and 4C are sectional views showing a configuration of an embodiment of a semiconductor device mounting method according to the present invention.
Figure 4B:
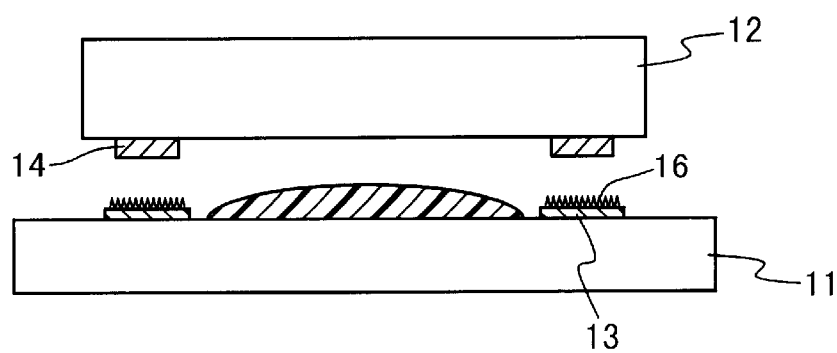
Figure 4C:
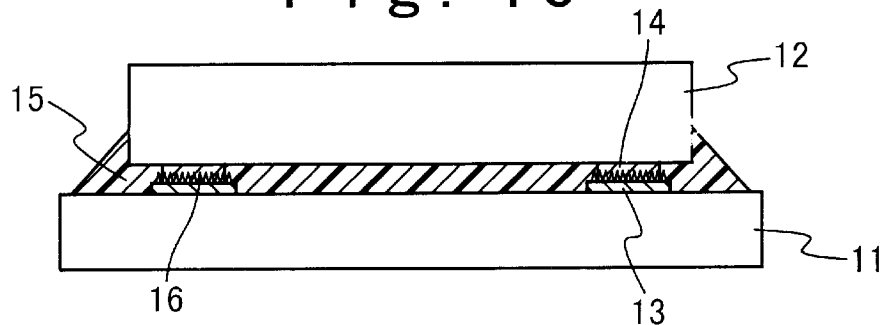

An embodiment of a semiconductor device mounting method according to the present invention will be described below with reference to FIGS. 4A, 4B and 4C. FIGS. 4A to 4C are views showing the configuration of the embodiment of the semiconductor device mounting method of the present invention.

The semiconductor device mounting method of the present invention includes the steps of (a) to (e).

The step (a) is forming the anchor portion 16 including the plurality of needle-like or branch-like plating (protrusions) on the surface of at least one of the mount pad 13 formed on the substrate 11 and the bump 14 formed on the side of the substrate 11 of the semiconductor device 12.

The step (b) is supplying the seal resin 15 onto the substrate 11.

The step (c) is positioning the semiconductor device 12 on the substrate 11 such that the bump 14 faces the mount pad 13. In this process, the anchor portion 16 (the plurality of needle-like or branch-like protrusions) formed on the surface of the mount pad 13 formed on the substrate 11 is stuck to (engaged with) the bump 14 (or on the surface of the bump 14 formed on the semiconductor device 12 is stuck to (engaged with) the mount pad 13).

The step (d) is pressing the semiconductor device 12 on the substrate 11. In this process, the anchor junction is formed so that the pad member (or the bump member) comes into contact with the periphery of the anchor portion 16 through the needle-like or branch-like plating.

The step (e) is heating the semiconductor device 12 and the substrate 11. This process is for curing the seal resin and/or performing a re-flow to form contact between the bump 14 and the mount pad 13.

FIG. 4 shows the semiconductor apparatus in which the needle-like or branch-like plating as the anchor portion 16 is formed on the pad 13. However, the plating may be formed on the bump 14.

The materials similar to those described in the explanations of the semiconductor apparatus of the present invention can be used as the materials of the substrate 11, the semiconductor device 12, the bump 14, the mount pad 13 and the plating of the anchor portion 16 used in the semiconductor device mounting method of the present invention.

In the semiconductor device mounting method of the present invention, the needle-like or branch-like plating as the anchor portion 16 is firstly formed on the surface of the mount pad 13 formed on the substrate 11 (or on the surface of the bump 14 formed on the side of the substrate 11 of the semiconductor device 12).

The method of forming the needle-like or branch-like plating has no particular limitation. However, it can be formed by using the conventional known plating method.

Next, as shown in FIG. 4A, the seal resin 15 is supplied onto the substrate 11. As the method of supplying the seal resin 15, the method traditionally used in the semiconductor device mounting method can be used without any limitation. For example, a supplying method of using a screen print method or a dispenser and the like is used.

As shown in FIG. 4B, the semiconductor device 12 is positioned on the substrate 11 such that the bump 14 faces the mount pad 13 (face-down), and then place the semiconductor device 12 on the substrate 11. At this time, the needle-like or branch-like plating (protrusions) formed on the surface of the mount pad 13 of the substrate 11 (or on the surface of the bump 14 on the side of the substrate 11 of the semiconductor device 12) is stuck to the bump 14 or the mount pad.

In the condition that the seal resin 15 is supplied onto the substrate 11, the positions of the bump 14 and the mount pad 13 are made coincide with each other. Then, a pressing operation causes the semiconductor device 12 to be connected to the substrate 11. At this time, the needle-like or branch-like plating formed on the mount pad 13 (or the bump 14) is stuck to the bump 14 (refer to FIG. 4C) strongly. Thus, the anchor junction is formed.

Next, the seal resin 15 is cured. As the seal resin 15, the thermally curing resin is used as mentioned above. Thus, the seal resin 15 is heated and cured. The heating temperature and the heating time in this case are different depending on the kind of the used seal resin and the used amount.

In this heating process, by heating the semiconductor device 12 and the substrate 11, a re-flow process for forming contact between the bump 14 and the mount pad 13 may be also performed, if needed.

Also, in the semiconductor device mounting method of the present invention, the unit which heats and cures the seal resin 15 is desired to be different from the unit which carries out the process mounting the semiconductor device 12 on the substrate 11.

Since the seal resin 15 is cured by the unit different from the unit mounting the semiconductor device 12 on the substrate 11, the mass production of the semiconductor apparatus can be attained without preparing a large number of expensive units.

The present invention will be described below in detail with reference to the embodiments. The range of the present invention is not limited to such embodiments.

(First Embodiment)

Figure 5:
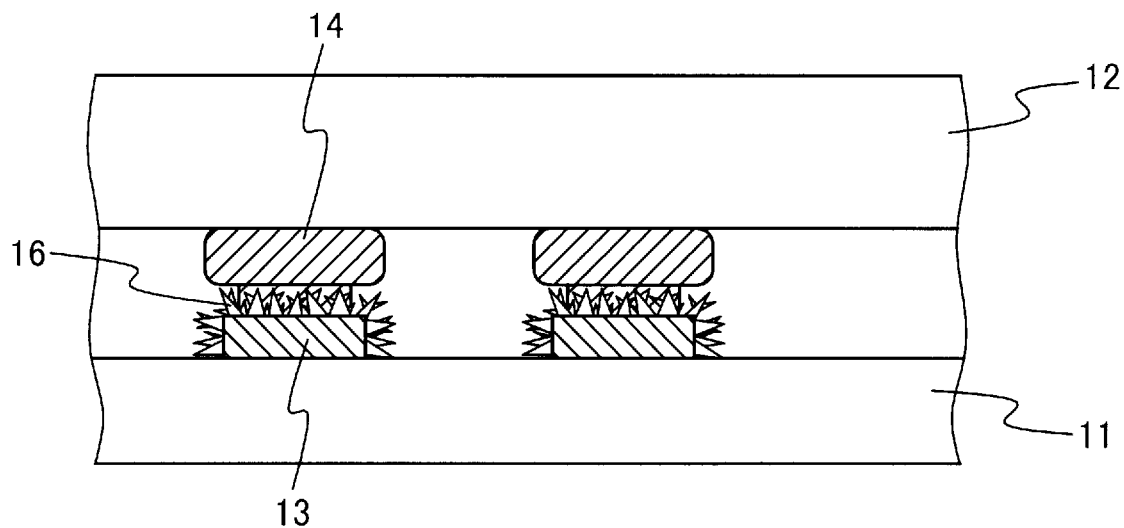
FIG. 5 is a sectional view showing an embodiment of a semiconductor apparatus according to the present invention.

FIG. 5 is a sectional view showing the embodiment of the present invention. As shown in FIG. 5, the branch-like protrusion formed by the needle-like plating as the anchor portion 16 is formed on the mount pad 13 formed on the substrate 11. In the semiconductor apparatus shown in FIG. 5, a pitch between the pads of the semiconductor device 12 is 60 μm or more. The bump 14 uses a gold protruded bump formed by wire bonding.

A non-directional branch-like protrusion having a height of 10 to 15 μm (at least a pair of needle-like protrusions protruded in directions crossing each other) is formed on the mount pad 13 by plating. The number of the protrusions is 5 to 10 per an area of 10 μm×10 μm square (50000 to 100000 per mm$^2$). Ni plating having a thickness of 2 to 3 μm and Au plating having a thickness of 0.5 μm are coated on the anchor portion 16 of the needle-like plating. The positions of the mount pad 13 and the bump 14 are made coincide with each other, and the semiconductor device 12 is connected with the substrate 11 by a pressure of 20 g/bump at a temperature of 200° C. The gold protruded bump uses a twitch bump in order to reduce the time for the bump formation. Thus, the semiconductor device 12 is placed at 20 g/bump in order to crush a tip of the bump 14 and expand an area in contact with the needle-like or branch-like plating on the mount pad 13. In this embodiment, the bump 14 is the gold bump, and the gold plating is coated on the needle-like plating. Thus, solid phase diffusion occurs from one gold portion to the other one, which results in pressed adhered state. Hence, the excellent electrical mechanical connection can be attained.

(Second Embodiment)

Figure 6:
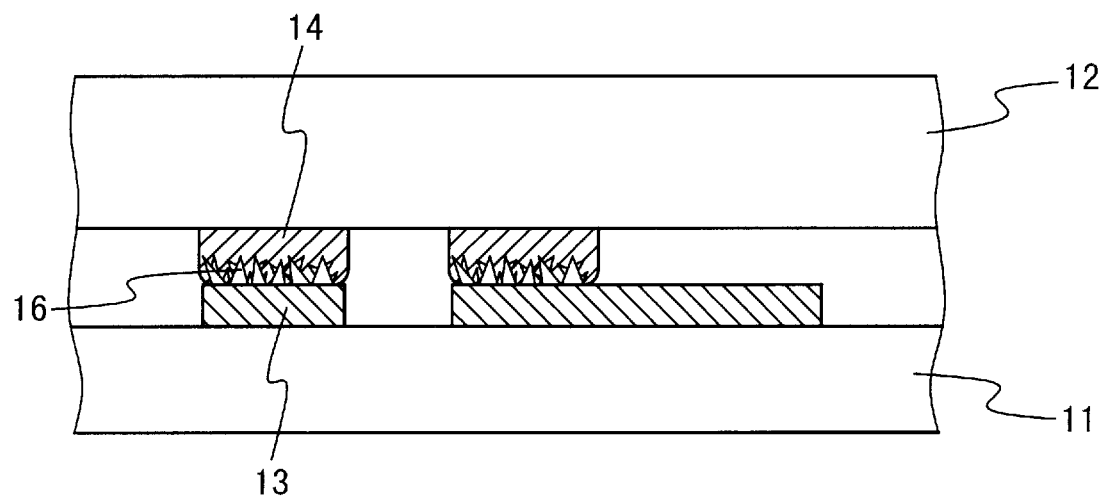
FIG. 6 is a sectional view showing another embodiment of a semiconductor apparatus according to the present invention.

FIG. 6 is a sectional view showing another embodiment of the semiconductor apparatus of the present invention. In the embodiment shown in FIG. 6, a pitch between the pads is 50 μm or less. Gold plating is used as the bump 14 formed on the side of the substrate 11 of the semiconductor device 12.

Also, the substrate 11 is formed by using a semi-additive process. The needle-like plating as the anchor portion 16 is formed only on the mount pad 13 so as not to bring about the short between the mount pad 13 and any one of the adjacent mount pad 13.

Thin copper plating is coated on the surface of the substrate 11 by electroless plating, and a wiring pattern is formed by plating resist. Then, the wiring is formed by electrolytic copper plating. Next, plating resist is formed so as to open only the portion of the mount pad 13. A non-directional needle-like protrusion having a height of 5 to 10 μm (at least a pair of needle-like protrusions protruded in directions crossing each other) is formed by plating. The number of the protrusions is 10 to 20 per an area of 10 μm×10 μm square (100000 to 200000 per mm$^2$). After that, the plating resist and the thin copper plating are removed. The needlelike plating is obtained by reducing the plating time of the first embodiment to a quarter thereof.

Next, solder resist is formed so as to open the portion of the mount pad 13 and the other necessary portions, and Ni plating of 2 to 3 μm and Au plating of 0.5 μm are coated.

The positions of the mount pad 13 and the bump 14 are made coincide with each other. The semiconductor device 12 is placed by the pressure of 5 g/bump at a temperature of 200° C. In the plating bump, a top thereof is flat, and it is not necessary to crush such as the protruded bump. Thus, the pressure of approximately 5 g/bump is enough to stick the needle-like plating to the bump 14.

Also in this embodiment, the gold plating is coated on the bump 14, and the gold plating is coated on even the needle-like plating. Thus, the solid phase diffusion occurs from one gold portion to the other one, which results in the pressed adhered state. Hence, the excellent electrical mechanical connection can be attained.

(Third Embodiment)

FIG. 7 is a sectional view showing another embodiment of the semiconductor apparatus of the present invention. In the embodiment shown in FIG. 7, a pitch between the pads is 50 μm or less. The needle-like plating as the anchor portion 16 is formed on the bump 14 formed on the side of the substrate 11 of the semiconductor device 12.

Plating resist is formed on the semiconductor device 12, the portion of the mount pad 13 is opened, and the bump is formed by electroless Ni plating. Then, a non-directional needle-like protrusion having a height of 5 to 10 μm (at least a pair of needle-like protrusions protruded in directions crossing each other) is formed by plating. The number of the protrusions is 10 to 20 per an area of 10 μm×10 μm square (100000 to 200000 per mm$^2$). Then, Ni plating of 2 to 3 μm and Au plating of 0.5 μm are coated thereon.

The substrate 11 is produced by using the full additive process. A thickness of copper plating of wiring is thinner by about 8 μm than that of permanent resist. Then, solder resist is formed so as to open the portion of the pad portion 13 and the other necessary portions, and Ni plating of 2 to 3 μm and Au plating of 5 μm are formed.

The positions of the mount pad 13 and the bump 14 are made coincide with each other. The semiconductor device 12 is placed by the pressure of 5 g/bump at a temperature of 200° C. The needlelike plating on the side of the bump 14 is stuck to the gold plating of the mount pad 13 formed on the substrate 11. Accordingly, the pressed adhered state resulting from the solid phase diffusion can be attained. In this embodiment, the needle-like plating exists only on the bump 14 formed on the side of the substrate 11 of the semiconductor device 12. Thus, there is no possibility that the surface of the semiconductor device 12 is damaged by the needle-like plating, as compared with the case in which the needle-like plating is formed on the wiring.

(Fourth Embodiment)

FIG. 8 is a sectional view showing another embodiment of the semiconductor apparatus of the present invention. As shown in FIG. 8, the semiconductor apparatus in this embodiment has the seal resin 15 between the semiconductor device 12 and the substrate 11.

In the embodiment shown in FIG. 8, a pitch between the pads is 50 μm or less. Gold plating is used as the bump 14 formed on the side of the substrate 11 of the semiconductor device 12.

Also, the substrate 11 is formed by using the semi-additive process. The needle-like plating as the anchor portion 16 is formed only on the mount pad 13 so as not to bring about the short between the mount pad 13 and any one of the adjacent mount pads 13.

To do so, thin copper plating is coated on the surface of the substrate 11 by the electroless plating, and a wiring pattern is formed by the plating resist. Then, the wiring is formed by the electrolytic copper plating. Next, plating resist is formed so as to open only the portion of the mount pad 13. A non-directional needle-like protrusion having a height of 5 to 10 μm (at least a pair of needle-like protrusions protruded in directions crossing each other) is formed by the plating. The number of the protrusions is 10 to 20 per an area of 10 μm×10 μm square (100000 to 200000 per mm$^2$). After that, the plating resist and the thin copper plating are removed. The needle-like plating is obtained by reducing the plating time of the first embodiment to a quarter thereof.

Next, solder resist is formed so as to open the portion of the mount pad 13 and the other necessary portions, and Ni plating having a thickness of 2 to 3 µm and Au plating having a thickness of 0.03 µm are coated.

When the semiconductor device 12 is placed, the thermally curing resin (seal resin 15) is firstly coated in advance on the portion where the semiconductor device 12 of the substrate 11 is placed, and the positions of the mount pad 13 and the bump 14 are made coincide with each other by using a chip mounting machine. Then, the semiconductor device 12 is placed by the pressing and heating operation of 5 g/bump at a temperature of 100° C. for one second. In the plating bump, a top thereof is flat, and it is not necessary to crush such as the protruded bump. Thus, the pressure of 5 g/bump is enough to stick the needle-like plating.

Next, by using a thermally pressing operation, the thermally curing resin 15 is cured under a pressure of 5 g/bump at a temperature of 230° C. It is not necessary to cure the thermally curing resin 15 when the semiconductor device 12 is placed. Thus, it can be placed at an ordinal temperature, differently from the conventional semiconductor mounting method. Also, a time in the thermally pressing time can be set to be 30 seconds or less depending on a usage resin. Moreover, it can be treated in a constant temperature bath.

In the conventional semiconductor device mounting method, it is necessary to continue the pressing and heating operation within the mounting machine until the thermally curing resin is cured, and it is also necessary to occupy the expensive chip mounting machine for a long time. However, in the semiconductor device-mounting machine regarding the present invention, the needle-like plating is stuck to the bump 14, and the bump 14 and the mount pad 13 are mechanically fixed. Thus, even if the semiconductor apparatus mounting the semiconductor device 12 on the substrate 11 in the condition that the resin is not cured, there is no deviation of the relative position between the bump 14 and the mount pad 13. Hence, it can be moved to a thermally pressing machine that is cheap since it does not have any positioning mechanism. Then, a plurality of semiconductor apparatuses can be collectively pressed and heated so that the thermally curing resin can be cured.

The seal resin is cured by a unit different from the unit mounting the semiconductor device 12 on the substrate 11.

Due to such configuration, the mass production of the semiconductor apparatus can be attained without preparing a large number of expensive units.

Also, in this embodiment, the thermally curing resin is used to fix the semiconductor device 12 and the substrate 11 to each other. Thus, it is not always necessary to establish the metallic junction between the needle-like plating and the bump 14. Hence, it is possible to use flash Au plating of 0.03 µm.

As mentioned above, the mechanical connection force between the substrate and the semiconductor device is improved in the semiconductor apparatus of the present invention.

Also, according to the semiconductor device mounting method of the present invention, it is possible to obtain the semiconductor apparatus in which the mechanical connection force between the semiconductor device and the substrate is improved.

What is claimed is:

1. A semiconductor apparatus comprising:
a mount pad formed on a substrate; and
a bump formed on a semiconductor device;
wherein a plurality of needle-like or branch-like protrusions is formed on said bump, and said plurality of protrusions of said bump engages with the mount pad.

2. The semiconductor apparatus according to claim 1, wherein said plurality of protrusions protrudes in directions crossing each other.

3. The semiconductor apparatus according to claim 1, wherein said plurality of protrusions protrudes to random directions.

4. The semiconductor apparatus according to claim 1, wherein a length of said plurality of protrusions is 5 to 10 µm.

5. The semiconductor apparatus according to claim 4, wherein a number of said plurality of protrusions is 100000 to 200000/mm2.

6. The semiconductor apparatus according to claim 1, wherein a length of said plurality of protrusions is 10 to 15 µm.

7. The semiconductor apparatus according to claim 6, wherein a number of said plurality of protrusions is 50000 to 100000/mm2.

8. The semiconductor apparatus according to claim 1, wherein said substrate is produced by one of a full additive process and a sub additive process, and said plurality of protrusions is formed only on a side of said semiconductor device of said mount pad.

9. The semiconductor apparatus according to claim 1, wherein said plurality of protrusions is coated with Au.

10. The semiconductor apparatus according to claim 1, wherein said bump includes Au.

11. The semiconductor apparatus according to claim 1, wherein said mount pad includes Au.

12. The semiconductor apparatus according to claim 1, wherein said protrusions are coated with a low temperature brazing filler metal of non-lead system.

13. The semiconductor apparatus according to claim 1, wherein said plurality of protrusions is formed by a plating method.

14. The semiconductor apparatus according to claim 1, wherein seal resin is filled between said semiconductor device and said substrate.

15. A semiconductor device mounting method comprising the steps of:
(a) forming a plurality of needle-like or branch-like protrusions on a surface of a bump formed on a semiconductor device; and
(b) positioning said semiconductor device on said substrate such that said bump faces said mount pad and said plurality of protrusions of the bump engages with the mount pad.

16. The semiconductor device mounting method according to claim 15, wherein said (b) positioning step comprises the step of:
(c) pressing said semiconductor device on said substrate.

17. The semiconductor device mounting method according to claim 16, wherein said (c) pressing step comprises the step of:
(d) heating said semiconductor device and said substrate at temperature sufficient to form contact between said bump and said mount pad.

18. The semiconductor device mounting method according to claim 15, wherein said (a) forming step uses a plating method for forming said plurality of protrusions.

19. The semiconductor device mounting method according to claim 15, wherein said (a) forming step comprises the step of:
(e) supplying seal resin onto said substrate;
wherein said (b) positioning step comprises the step of:
(f) curing said seal resin.

20. The semiconductor device mounting method according to claim 19, further comprising:

placing said semiconductor device on said substrate by a pressing and heating operation performed by a first unit, and wherein said curing said seal resin is performed using a second unit different from said first unit placing said semiconductor device on said substrate.

21. The semiconductor device mounting method of claim 20, wherein said heating and pressing operation is performed at 5 g/bump at a temperature of 100 degrees Celcius for one second.

22. The semiconductor device mounting method of claim 20, wherein said semiconductor device and said substrate are mechanically fixed as a result of said placing operation.

23. The semiconductor device mounting method of claim 21, wherein said curing said seal resin is performed at a pressure of 5 g/bump and at a temperature of 230 degrees Celcius.

24. A semiconductor device mounting method comprising:

forming a plurality of needle-like protrusions on a surface of at least one of a mount pad on a substrate and a bump formed on a semiconductor device;

supplying seal resin onto said substrate;

placing said semiconductor device on said substrate such that said bump faces said mount pad;

pressing and heating said semiconductor device such that said substrate and said semiconductor device are mechanically fixed such that said plurality of protrusions of one said mount pad and said bump engages with the other; and curing said seal resin.

25. The method of claim 24 wherein said pressing and heating are performed at 5 g/bump at a temperature of 100 degrees Celcius for one second.

26. The method of claim 25, wherein said curing is performed under a pressure of 5 g/bump at a temperature of 230 degrees Celcius.

* * * * *